(12) United States Patent
Basol et al.

(10) Patent No.: US 12,313,669 B2
(45) Date of Patent: May 27, 2025

(54) METHODS AND TOOLS FOR ELECTRICAL PROPERTY DEPTH PROFILING USING ELECTRO-ETCHING

(71) Applicant: Active Layer Parametrics, Inc., Scotts Valley, CA (US)

(72) Inventors: Bulent Mehmet Basol, Manhattan Beach, CA (US); Abhijeet Joshi, San Jose, CA (US)

(73) Assignee: Active Layer Parametrics, Inc., Scotts Valley, CA (US)

( * ) Notice: Subject to any disclaimer, the term of this patent is extended or adjusted under 35 U.S.C. 154(b) by 114 days.

(21) Appl. No.: 18/305,280

(22) Filed: Apr. 21, 2023

(65) Prior Publication Data

US 2024/0353472 A1    Oct. 24, 2024

(51) Int. Cl.
*G01N 27/407*    (2006.01)
*G01R 31/26*     (2020.01)

(52) U.S. Cl.
CPC ............... *G01R 31/2648* (2013.01)

(58) Field of Classification Search
CPC .................................................. G01R 31/2648
See application file for complete search history.

(56) References Cited

U.S. PATENT DOCUMENTS

| | | | |
|---|---|---|---|
| 3,554,891 A | 1/1971 | Duffy et al. |
| 3,660,250 A | 5/1972 | Duffy et al. |
| 4,190,488 A | 2/1980 | Winters |
| 4,303,482 A | 12/1981 | Buhne et al. |
| 5,150,042 A | 9/1992 | Look et al. |
| 5,217,907 A | 6/1993 | Bulucea et al. |
| 5,652,151 A | 7/1997 | Asada |
| 6,087,189 A | 7/2000 | Huang |
| 6,136,213 A | 10/2000 | Shinozuka et al. |
| 6,290,864 B1 | 9/2001 | Patel et al. |
| 6,409,876 B1 | 6/2002 | Mcquarrie et al. |
| 6,500,356 B2 | 12/2002 | Goto et al. |

(Continued)

FOREIGN PATENT DOCUMENTS

| | | |
|---|---|---|
| CN | 103165724 A | 6/2013 |
| EP | 1237179 A1 | 9/2002 |

(Continued)

OTHER PUBLICATIONS

International Search Report received for PCT Patent Application No. PCT/US2017/029424, mailed on Oct. 2, 2017, 6 pages.

(Continued)

*Primary Examiner* — Alesa Allgood
(74) *Attorney, Agent, or Firm* — Kubota & Basol LLP

(57) ABSTRACT

In some embodiments, a method includes forming a mini chamber over a test region, the mini chamber comprising an inlet, an outlet and an electrode, introducing an electrolyte solution into the mini chamber through the inlet, applying an electro-etching potential difference between the electrode and at least one contact region and reducing the thickness of a semiconductor film portion at the test region forming a thinned down semiconductor film portion, replacing the electrolyte solution in the mini chamber with a fluid that is substantially insulating, and determining the electrical property of the thinned down semiconductor film portion while the fluid is in the mini chamber.

24 Claims, 3 Drawing Sheets

(56) References Cited

U.S. PATENT DOCUMENTS

| | | | |
|---|---|---|---|
| 6,554,205 | B1 | 4/2003 | Shinozuka et al. |
| 6,649,528 | B2 | 11/2003 | Yanagisawa et al. |
| 6,736,987 | B1 | 5/2004 | Cho |
| 6,887,337 | B2 | 5/2005 | Lebouitz et al. |
| 6,908,566 | B2 | 6/2005 | Yanagisawa et al. |
| 7,041,224 | B2 | 5/2006 | Patel et al. |
| 7,078,919 | B2 | 7/2006 | Prussin |
| 7,094,355 | B2 | 8/2006 | Yanagisawa et al. |
| 8,278,222 | B2 | 10/2012 | Wu et al. |
| 10,796,056 | B2 | 10/2020 | Northrop et al. |
| 11,699,622 | B2 | 7/2023 | Basol et al. |
| 2002/0142599 | A1 | 10/2002 | Mcquarrie et al. |
| 2003/0016032 | A1 | 1/2003 | Licini et al. |
| 2004/0063329 | A1 | 4/2004 | Yanagisawa et al. |
| 2004/0203177 | A1 | 10/2004 | Davis et al. |
| 2005/0052191 | A1 | 3/2005 | Prussin |
| 2005/0124085 | A1 | 6/2005 | Andoh et al. |
| 2011/0163314 | A1* | 7/2011 | Park .................. G01N 27/4074 257/53 |
| 2015/0349375 | A1* | 12/2015 | Takahashi ......... H01M 10/0436 |
| 2016/0079075 | A1 | 3/2016 | Leseman et al. |
| 2017/0350839 | A1* | 12/2017 | Momose ............ G01N 27/4141 |
| 2019/0148248 | A1 | 5/2019 | Basol et al. |
| 2020/0219778 | A1 | 7/2020 | Basol et al. |
| 2022/0216118 | A1 | 7/2022 | Basol et al. |

FOREIGN PATENT DOCUMENTS

| | | |
|---|---|---|
| GB | 2281402 B | 3/1997 |
| TW | 200512893 A | 4/2005 |
| TW | 201420201 A | 6/2014 |
| TW | 201535507 A | 9/2015 |

OTHER PUBLICATIONS

Non-Final Office Action received for U.S. Appl. No. 16/095,930, mailed on Dec. 26, 2019, 6 pages.

Notice of Allowability received for U.S. Appl. No. 17/656,556, mailed on Feb. 24, 2023, 10 pages.

Notice of Allowance received for U.S. Appl. No. 16/095,930, mailed on Apr. 14, 2020, 6 pages.

Notice of Allowance received for U.S. Appl. No. 16/820,447, mailed on Dec. 16, 2021, 8 pages.

Restriction Requirement received for U.S. Appl. No. 16/820,447, mailed on Sep. 30, 2021, 5 pages.

Bartels, et al., "A Procedure for Temperature-Dependent, Differential Van Der Pauw Measurements", Review of scientific Instruments, vol. 66, No. 8 Available online at: <https://aip.scitation.org/doi/10.1063/1.1145381>, 1995, pp. 4271-4276.

Butner, et al., "The Effect of Temperature on the Etch Rate and Roughness of Surfaces Etched With XEF2", Proceedings of ASME 2010 International Mechanical Engineering Congress and Exposition. American Society of Mechanical Engineers Digital Collection, 2010, 4 pages.

Easter, et al., "XeF2 Etching Of Silicon For The Release Of Micro-Cantilever Based Sensors", Proceedings of ASME 2008 International Mechanical Engineering Congress and Exposition. American Society of Mechanical Engineers Digital Collection, 2008, pp. 697-701.

Galloni, et al., "Fully Automatic Apparatus For The Determination Of Doping Profiles In Si By Electrical Measurements And Anodic Stripping", Review of scientific instruments, vol. 54, No. 3, 1983, pp. 369-373.

Kanarik, et al., "Overview of Atomic Layer Etching in the Semiconductor Industry", Journal of Vacuum Science & Technology A: Vacuum, Surfaces, and Films, vol. 33, No. 2, Mar. 5, 2015, 15 pages.

Keithley, "Performing van der Pauw Sheet Resistance Measurements Using the Keithley S530 Parametric Tester", Application Note Series, No. 3180, Keithley Instruments, Inc., Aug. 1, 2012, 4 pages.

Klein, et al., "Characterization of in situ Etched And Molecular Beam Epitaxy Regrown GaAs Interfaces Using Capacitance-Voltage Measurements, Far Infrared Spectroscopy, And Magnetotransport Measurements", Journal of Vacuum Science & Technology B: Microelectronics and Nanometer Structures Processing, Measurement, and Phenomena, vol. 18, No. 3, 2000, pp. 1562-1565.

Oehrlein, et al., "Atomic Layer Etching at the Tipping Point: An Overview", ECS Journal of Solid State Science and Technology, vol. 4, No. 6, 2015, pp. 5041-5053.

* cited by examiner

METHODS AND TOOLS FOR ELECTRICAL PROPERTY DEPTH PROFILING USING ELECTRO-ETCHING

FIELD OF THE INVENTION

The present inventions are in the field of electrical characterization of thin films. More particularly, the present inventions provide methods and tools for electrical characterization of layers employed in advanced semiconductor device structures.

BACKGROUND

With the advancement of the semiconductor industry, electronic devices such as integrated circuits, LEDs, sensors, solar cells, RF/Power devices, etc., are getting more and more complex and they employ layers comprising a wide range of materials including Ge, Si, SiGe, SiC, and III-V compound semiconductors. To be able to develop and optimize such advanced devices, it is important to accurately measure the electrical properties of the layers through their thickness. Some of the techniques that have been used to obtain electrical property depth profiles through semiconductor layers include Spreading Resistance Profiling (SRP), Scanning Spreading Resistance Microscopy (SSRM), and Electrochemical C-V profiling (E-CV).

Some electrical property depth profiling techniques have utilized approaches that require repeated application of electrical contacts to the surface of a film after the thickness of the film is reduced (see for example U.S. Pat. Nos. 3,554,891 and 3,660,250). Another technique for generating a depth profile involves anodic oxide film formation over the surface of the semiconductor layer followed by electrical measurements (see for example U.S. Pat. No. 7,078,919). This approach may be applicable to materials, such as silicon (Si), that may form substantially insulating oxide layers as a result of an anodic oxidation process. However, it may not work for other materials, such as germanium (Ge) or high Ge containing SiGe alloys, that may not form stable and substantially insulating anodic oxide films. Therefore, new methods and apparatus are needed with capability to accurately, reliably and rapidly depth profile electrical properties of such semiconductor layers.

DETAILED DESCRIPTION OF THE INVENTION

Present inventions provide methods and apparatus for measurement of an electrical property of a semiconductor film as its thickness is reduced in predetermined steps at a test region of a test pattern, so that a depth profile of the electrical property may be obtained. The semiconductor film to be characterized may be disposed over a substrate such as a wafer. There may be an insulating interface between the semiconductor film and the substrate. The electrical property may be at least one of sheet resistance, resistivity, mobility and carrier concentration. A characterization tool may be used to obtain the depth profile of the electrical property, the tool comprising a substrate holder, at least one process head, a mechanism that may provide relative motion between the substrate holder and the at least one process head, chemistry sources providing at least one electrolyte solution and at least one nonelectrolyte, a pumping and plumbing system to deliver and remove the at least one electrolyte solution and the at least one nonelectrolyte to and from the at least one process head, plumbing assembly to connect a source of a gaseous substance to the process head, an electrical measurement system, and a computerized control system configured to control and determine all functions of the tool including deciding when to deliver the at least one electrolyte solution, the at least one nonelectrolyte and the gaseous substance to the process head, and when to terminate measurement of the electrical property once an end-point is reached.

Figure 1:
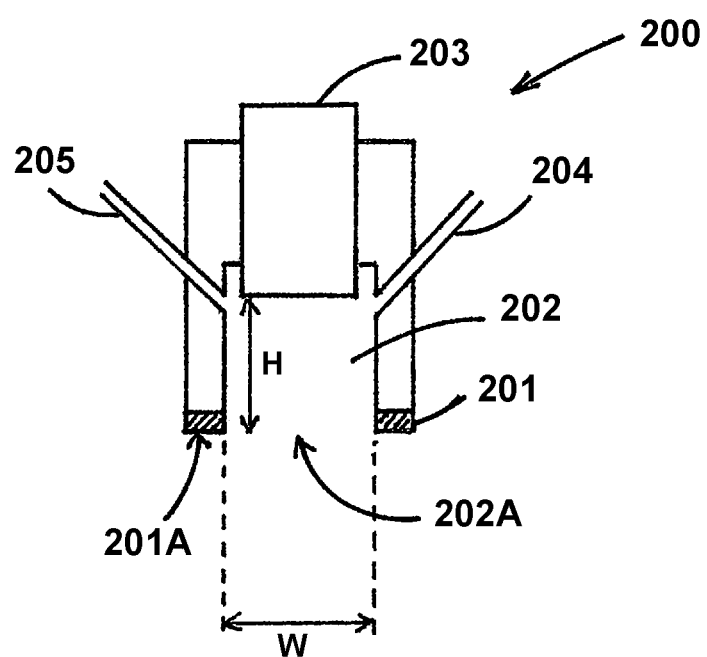
FIG. 1 is a cross-sectional side view of an exemplary process head comprising a process cavity.

FIG. 1 shows an exemplary process head 200 constructed in accordance with a preferred embodiment of the present inventions. The process head 200 may comprise a process cavity 202 with walls and an open end 202A, an electrode 203, an inlet 204 and an outlet 205 that are connected to the process cavity 202 and configured to flow a liquid or gaseous substance into and out of the process cavity 202. The electrode 203 may comprise a conductive material such as platinum. A sealing member 201 with a bottom surface 201A may be provided along the edge of the open end 202A of the process cavity 202. The sealing member 201 may preferably be made of an elastomer such as silicone rubber. The electrode 203 may be disposed at a set distance "H" from the open end 202A. "W" is a distance between the inner corners of the sealing member 201.

Figure 2A:
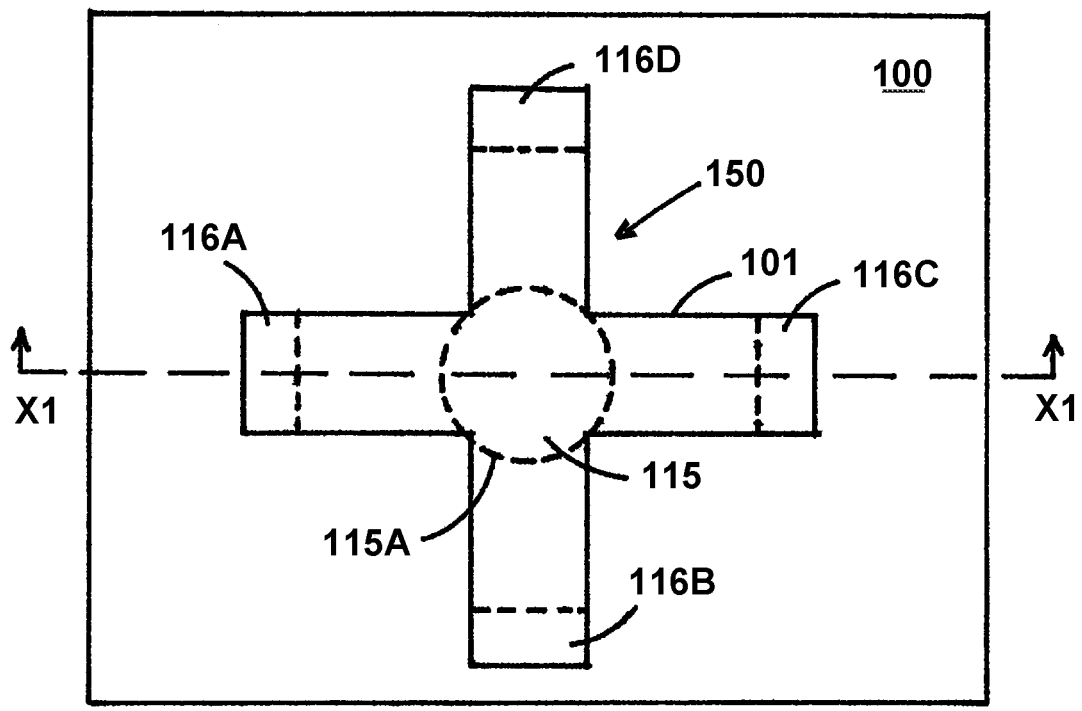
FIG. 2A shows a top view of a cross-shaped test pattern of a semiconductor film to be characterized, the test pattern comprising a top surface, a circular test region and four contact regions.
Figure 2B:
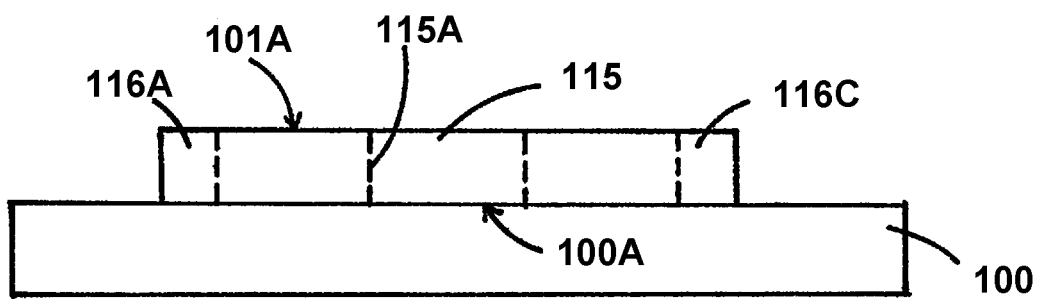
FIG. 2B shows a cross-sectional side view of the structure shown in FIG. 2A.

To obtain a depth profile of an electrical property through a layer employing the teachings of the present inventions, a pattern of the layer may first be formed. FIG. 2A shows a top view of a test pattern 150 comprising a semiconductor film 101 to be measured or characterized. FIG. 2B shows a cross-sectional side view of the structure in FIG. 2A, taken along the line X1-X1. As can be seen from FIG. 2A and FIG. 2B, the semiconductor film 101 may be disposed over a substrate 100, and the test pattern 150 may be in the form of a cross. The semiconductor film 101 may have a top surface 101A, and may be electrically isolated from the substrate 100 by an insulating interface 100A. The insulating interface 100A may comprise a thin insulating layer or a rectifying junction, such as a p-n junction, that may not allow any substantial portion of an electrical current to flow through the substrate 100 when the electrical current is passed through the semiconductor film 101 between any two points on the test pattern 150. The test pattern 150 may comprise a test region 115 and at least two contact regions that are outside the test region 115. It should be noted that the test region 115 comprises a semiconductor film portion that gets characterized by the teachings of the present inventions.

As can be seen from the example of FIG. 2A, the test pattern 150 may comprise a first contact region 116A, a second contact region 116B, a third contact region 116C, and a fourth contact region 116D. It should be noted that the contact regions may be touched or contacted by contact elements (not shown) that may electrically connect them to power supplies or measurement instruments to apply power to the test pattern 150, as well as, to carry out voltage and current measurements. Although two contact regions may be adequate for sheet resistance measurements, it may be preferred to use at least four contact regions for determination of all electrical properties. Although, a perimeter 115A of the test region 115 may be circular as shown in FIG. 2A, it may be any other shape, provided that substantially all of an electrical current passing between any two contact regions may pass through the test region 115. This means that substantially all of the electrical current passing between any two contact regions may pass through the semiconductor film portion at the test region 115. The shape of the test region 115, when viewed from the top, may be defined by the shape of the open end 202A of the process cavity 202, and an area of the test region 115 may be equal to a cross-sectional area of the open end 202A. In the example depicted in FIG. 1, FIG. 2A, FIG. 2B and FIG. 3, when the process cavity 202 is sealed against the top surface 101A, the circular shape of the test region 115 is defined by the circular shape of the open end 202A of the process cavity 202. As shown in FIG. 1 and FIG. 2A, the circular shape of the test region 115 has a diameter of "W". It should be noted that "W" may also be defined, in general, as a distance between two points on a perimeter of a test region measured in a direction that may be substantially parallel to a flow direction of a test current passing between two contact regions during measurements.

Procedures for obtaining a depth profile of an electrical property through the semiconductor film 101 may include; i) measurement of the electrical property of the semiconductor film portion at the test region 115, ii) controlled thinning of the semiconductor film portion at the test region 115 by electro-etching, the electro-etching process yielding a thinned down semiconductor film portion with a uniform thickness at the test region 115, iii) measuring the electrical property of the thinned down semiconductor film portion, and iv) repeating steps ii) and iii), until an end-point may be reached. Data obtained this way can then be plotted in the form of the depth profile of the electrical property once differential calculations may be carried out.

Referring back to FIG. 2A and FIG. 2B, measuring the electrical property of the semiconductor film 101 may comprise determining an electrical property value such as a sheet resistance value for the semiconductor film portion at the test region 115 during a measurement period. Optionally, another electrical property such as a sheet Hall coefficient value or a mobility value may also be determined. To determine the sheet resistance value, a sheet resistance test current may be passed from the first contact region 116A to the fourth contact region 116D through the test region 115, and a potential difference may be measured between the second contact region 116B and the third contact region 116C. This data may then be used to calculate the sheet resistance value using the Van der Pauw equations (see for example, ASTM Standard F76-08). For determining the mobility value, a mobility test current may be passed from the first contact region 116A to the third contact region 116C, through the test region 115. A potential difference may be measured between the second contact region 116B and the fourth contact region 116D before and after a magnetic field is applied perpendicular to the top surface 101A. This data along with the sheet resistance value may then be used to calculate the mobility value as well as a carrier concentration value and a resistivity value, employing the Hall effect relationships (see ASTM Standard F76-08).

Figure 3:
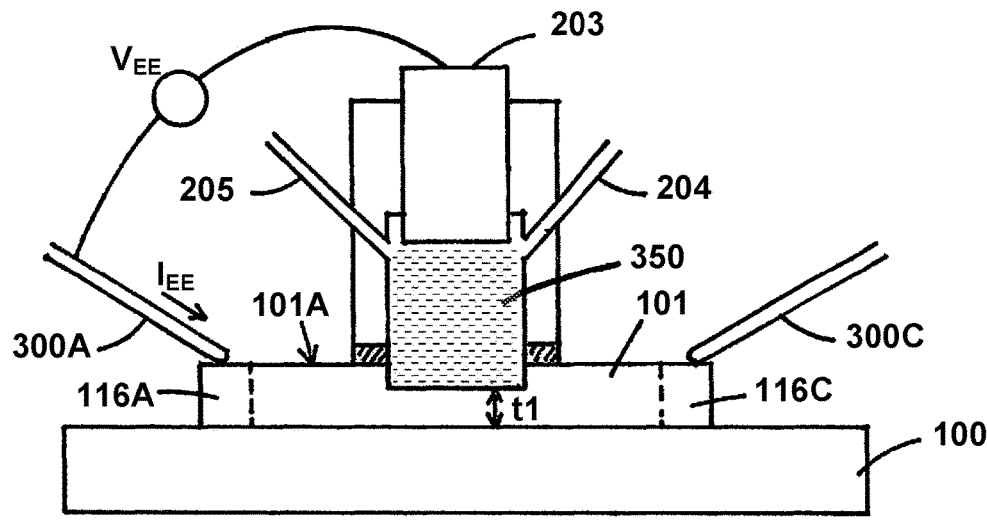
FIG. 3 shows a cross-sectional side view of the process cavity of FIG. 1 pressed and sealed against the top surface of the test pattern depicted in FIG. 2A and FIG. 2B, forming a mini chamber over the circular test region; an electrolyte solution filling the mini chamber; and a thinned down semiconductor film portion with uniform thickness "t1" obtained at the test region after an electro-etching step.

As shown in FIG. 3, the open end 202A of the process cavity 202 of the process head 200 (see FIG. 1) may be pressed and sealed against the top surface 101A (see also FIG. 2A and FIG. 2B), forming a mini chamber enclosed by walls of the process cavity 202, the electrode 203 and the test region 115, such that any fluid flown into the mini chamber may touch the electrode 203 and the entire test region 115, without touching any part of the top surface 101A outside the test region 115. A first contact element 300A touching the first contact region 116A and a third contact element 300C touching the third contact region 116C are also shown in FIG. 3. It should be noted that there may also be a second contact element touching the second contact region 116B and a fourth contact element touching the fourth contact region 116D, but they are not visible in the cross-sectional view of FIG. 3. As stated before, contact elements may provide electrical connection to the contact regions for delivering current and voltage and for measuring current and voltage.

As shown FIG. 3, an electrolyte solution 350 may be flown into the mini chamber through the inlet 204. The electrolyte solution 350 may substantially fill the mini chamber touching both the test region 115 and the electrode 203. Then an electro-etching potential difference (VEE) may be applied between the electrode 203 and the first contact element 300A, during an electro-etching period. Preferably, all contact elements may be electrically shorted together during this step. The electro-etching potential difference VEE may render the first contact element 300A more positive with respect to the electrode 203 and produce an electro-etching current IEE that flows from the first contact element 300A to the electrode 203 through the semiconductor film portion at the test region 115 and through electrolyte solution 350. During the electro-etching period, a slice of the semiconductor film portion at the test region 115 may be removed leaving behind a thinned down semiconductor film portion with a uniform thickness "t1". The electro-etched slice may have a predetermined uniform thickness that may be related to the total charge passed during the electro-etching period. The electro-etching potential difference VEE may be removed at the end of the electro-etching period.

It should be noted that electrolytes are substances whose solutions in solvents conduct electricity, because they provide mobile ions. Therefore, the electrolyte solution 350 may comprise a solvent and an electrolyte to controllably and uniformly dissolve material at the test region 115 during the electro-etching period. The solvent may comprise at least one of deionized water and an organic compound. Examples of organic compounds include, but are not limited to glycols, such as propylene glycol, di-propylene glycol, and ethylene glycol. The electrolyte solution 350 may comprise ionic species, which assist electro-etching and make the electrolyte solution 350 conductive so that the electro-etching current IEE may pass between the test region 115 and the electrode 203 during the electro-etching period. A resistivity value for the electrolyte solution 350 may be in the range of 1-10,000 ohm-cm. Examples of electrolytes that may contribute ionic species to the electrolyte solution 350 include acids and salts comprising fluorine, chlorine, sulfur, nitrogen, phosphorous, carbon, hydrogen and oxygen as well as bases comprising a hydroxide. Electrolytes may comprise a chloride salt, hydrochloric acid, a nitrate salt, nitric acid, a sulfate salt, sulfuric acid, an acetate salt, acetic acid, an oxalate salt, oxalic acid, among others. Electrolytes may alternately comprise hydroxides of ammonium, sodium and potassium, among others. Some exemplary ionic species in the electrolyte solution 350 include, but are not limited to, $Cl^-$, $NO_3^-$, $SO_4^{2-}$, $C_2H_3O_2^-$, $HC_2O_4^-$, $NH_4^+$, and $OH^-$. The electrolyte solution 350 may further comprise additives such as wetting agents to improve material removal uniformity. As described before, procedures for obtaining the depth profile of the electrical property through the semiconductor film 101 may comprise measuring the electrical property of the thinned down semiconductor film portion during a measurement period that may follow the electro-etching period.

Figure 3A:
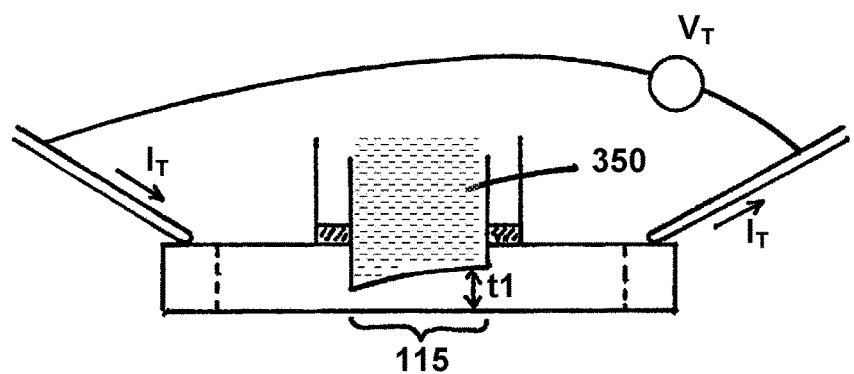
FIG. 3A shows the thinned down semiconductor film portion of FIG. 3 after a measurement period, displaying a thickness non-uniformity developing for the thinned down semiconductor film portion due to a leakage current passing through the electrolyte solution during the measurement period.

FIG. 3A depicts a case where a test voltage $V_T$ is applied between the first contact element 300A and the third contact element 300C to measure the electrical property of the thinned down semiconductor film portion, during the measurement period. As shown in this example, the test voltage $V_T$ may produce a test current $I_T$ flowing from the first contact element 300A towards the third contact element 300C. To carry out a valid measurement of the electrical property, it may be necessary that substantially all of the test current $I_T$ pass through the thinned down semiconductor film portion at the test region 115. However, the electrolyte solution 350, being conductive, may provide a leakage path, so that a fraction of the test current $I_T$ may flow through the electrolyte solution 350. This fraction of the test current $I_T$ may be called a leakage current. The leakage path may comprise a leakage sheet resistance which may be represented by the relationship; leakage sheet resistance=(electrolyte solution resistivity) divided by (a thickness of the sheet of the electrolyte solution over the test region). In the example of FIG. 3A, the thickness of the sheet of the electrolyte solution over the test region is "H". Consequence of the leakage current may be two-fold. First of all, the leakage current passing through the electrolyte solution 350 may affect the accuracy of the electrical measurements because it reduces the current passing through the thinned down semiconductor film portion. One may attempt to calculate the leakage current value and include this in the calculations. However, such an approach may not work due to the second consequence of the leakage current, which is the fact that the leakage current passing from the thinned down semiconductor film portion at the test region 115 into the electrolyte solution 350 may cause dissolution of material from the thinned down semiconductor film portion, as can be seen in FIG. 3A. Such dissolution may be due to unintended electro-etching and it may especially affect sections of the thinned down semiconductor film portion close to an entry point of the test current $I_T$ into the test region 115. As shown in FIG. 3A, unintended electro-etching during the measurement period may negatively alter the original thickness uniformity of the thinned down semiconductor film portion, which is shown in FIG. 3. It should be noted that unintended electro-etching during any measurement period may reduce the depth resolution of all the subsequent electrical parameter measurements, rendering them highly inaccurate, even if one determines the value of the leakage current and accounts for it in mathematical calculations to generate a depth profile of the electrical property. Such a depth profile data may not be valid since there would be unintended material removal from the test region 115, not only during electro-etching periods, but also during measurement periods. It should be noted that as more and more electro-etching steps are carried out, the thickness of the thinned down semiconductor film portion may become smaller and smaller and its sheet resistance may become higher and higher compared to the leakage sheet resistance. This may increase the magnitude of the leakage current and may exacerbate the problem depicted in FIG. 3A.

It should be noted that, if a width of the electrode 203 is comparable to "W" (as shown in FIG. 3A), and the value of "H" becomes very small compared to "W", then the leakage path may also include one that goes up to the highly conductive electrode 203 from a section of the thinned down semiconductor film portion closest to the first contact region 116A, and come back to another section of the thinned down semiconductor film portion closest to the third contact region 116C. To avoid this leakage path to become dominant it may be preferred to design the process cavity 200 such that H≥W/2.

Electrolyte solutions may also have the capability of chemically etching a semiconductor film that is being characterized. For example, hydroxide solutions, such as KOH in water, may be employed for electro-etching some III-V compounds such as GaN. However, such solutions may also chemically etch such compounds during a measurement period if the electrolyte solution is kept over the test region. Since obtaining a depth profile of an electrical property may comprise many measurement periods, which may add up to longer than 30 minutes, even longer than 60 minutes, there may be unintended chemical etching of the material at the test region by the electrolyte solution. It should be noted that such unintended chemical etching may reduce the depth resolution of the electrical parameter measurements, rendering them highly inaccurate, especially as the number of measurement periods increase. For example, if a total duration of the measurement periods is 60 minutes and a chemical etching rate of the electrolyte solution for an exemplary semiconductor layer getting characterized is 2 Å/minute (2 angstroms per minute), then the total unintentionally etched semiconductor layer thickness may add up to 120 Å. If the exemplary semiconductor layer getting characterized is only 500 Å thick, 120 Å of unintentional chemical etching may introduce an unacceptably large error into the calculations. Certain embodiments of the present inventions address the problems described above by replacing the electrolyte solution 350 with a fluid before the measurement period, wherein the fluid may be different than the electrolyte solution 350 and may be configured to be substantially inert toward the semiconductor film 101. Accordingly, a chemical etch rate of the semiconductor film 101 in the fluid may be less than 0.1 Å/minute, preferably less than 0.05 Å/minute. The fluid may also be substantially insulating to avoid passage of substantial leakage current during a measurement period.

Figure 3B:
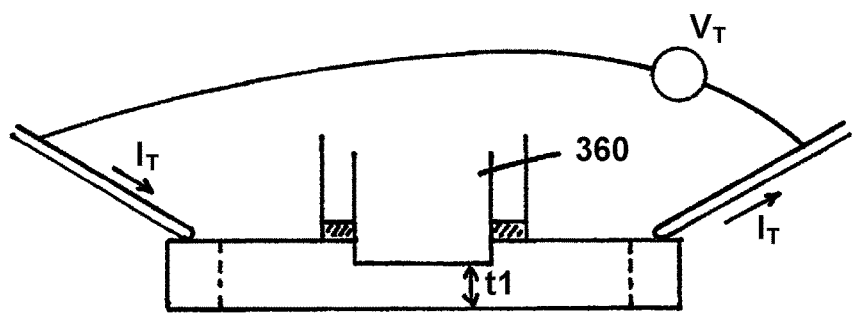
FIG. 3B shows the thinned down semiconductor film portion of FIG. 3 after a measurement period, wherein the electrolyte solution is replaced by a gas before the measurement period.

FIG. 3B shows a preferred embodiment of the present inventions, wherein the fluid is a gas 360. Accordingly, after the electro-etching period shown in FIG. 3, the electrolyte solution 350 may be removed from the mini chamber and replaced by the gas 360. Preferably, this procedure may be carried out without opening the mini chamber and without lifting the contact elements 300A and 300C off the contact regions 116A and 116C. This may be achieved by flowing the gas 360 into the mini chamber from the inlet 204 at high flow rate. The gas 360 flowing at high flow rate may push the electrolyte solution 350 out of the mini chamber through the outlet 205. The test voltage $V_T$ may then be applied between the first contact element 300A and the third contact element 300C to measure the electrical property of the thinned down semiconductor film portion during a measurement period. The test voltage $V_T$ may produce the test current $I_T$ flowing from the first contact element 300A to the third contact element 300C through the thinned down semiconductor film portion at the test region 115 without any leakage current present. Therefore, the uniform thickness "t1" of the thinned down semiconductor film portion may not be altered during the measurement period. The gas 360 may comprise an inert gas such as nitrogen and argon or it may comprise clean and dry air.

Figure 3C:
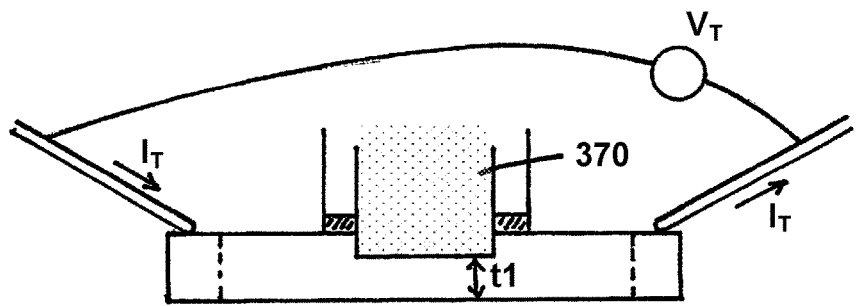
FIG. 3C shows the thinned down semiconductor film portion of FIG. 3 after a measurement period, wherein the electrolyte solution is replaced by a nonelectrolyte before the measurement period.

FIG. 3C shows another preferred embodiment of the present inventions, wherein the fluid is a nonelectrolyte. Nonelectrolytes are substances that may not have any distinct ionic form to exist in, when they are dissolved in aqueous solutions. Since they do not dissociate into ions, nonelectrolytes may be substantially insulating. They also may be configured to be chemically inert so that they do not substantially etch the thinned down semiconductor film portion during the measurement period. Accordingly, after the electro-etching period depicted in FIG. 3, the electrolyte solution 350 may be removed from the mini chamber and it may be replaced by a nonelectrolyte 370. The test voltage $V_T$ may then be applied between the first contact element 300A and the third contact element 300C to measure the electrical property of the thinned down semiconductor film portion. The test voltage $V_T$ may produce the test current $I_T$ flowing from the first contact element 300A to the third contact element 300C through the thinned down semiconductor film portion at the test region 115. Substantially all of the test current $I_T$ may pass through the thinned down semiconductor film portion. Therefore, the uniform thickness "t1" of the thinned down semiconductor film portion may not be substantially altered during the measurement period. In a preferred embodiment the nonelectrolyte 370 may comprise at least one of deionized water and an organic nonelectrolyte. The organic nonelectrolyte may comprise a glycol.

The above-mentioned steps of flowing the electrolyte solution into the mini chamber, electro-etching and forming the thinned down semiconductor film portion at the test region 115, delivering the fluid into the mini chamber, and measuring the sheet resistance value and optionally another electrical property of the thinned down semiconductor film portion, while the fluid is in the mini chamber may be repeated until an end-point may be reached. Once the end-point is reached, electro-etching and measurement cycles may be terminated and the test region 115 may be rinsed and dried. Data collected can be plotted in the form of a depth profile. The end-point in the case of using the gas as the fluid during the measurement period may be when the thickness of the thinned down semiconductor film portion approaches zero, i.e., when substantially all of the thinned down semiconductor film portion is removed by electro-etching. For the case of employing a nonelectrolyte in the mini chamber during the measurement periods, the end-point may be reached when the sheet resistance of the thinned down semiconductor film portion may reach a threshold value. The threshold value may preferably be larger than or equal to 1%, more preferably larger than or equal to 0.1% of a sheet resistance of the nonelectrolyte. Resistivity of a substantially insulating nonelectrolyte may be larger than 5 mega-ohm-cm, preferably larger than 10 mega-ohm-cm. With an exemplary "H" value of 0.4 cm, this may correspond to the sheet resistance value of at least 12.5 mega-ohm/square. Employing such a nonelectrolyte, measurements may continue until the sheet resistance of the thinned down semiconductor film portion becomes larger than or equal to 125,000 ohms/square. Selecting a nonelectrolyte with a resistivity of 10 mega-ohm-cm, depth profile of electrical parameters may be measured until the sheet resistance value of the thinned down semiconductor film portion becomes larger than or equal to 250,000 ohms/square. In a preferred embodiment of the present inventions the contact elements may continually touch the contact regions during all the steps of obtaining the depth profile of the electrical property, thus avoiding potential damage to the contact regions that may result from multiple contact making (touching) and contact breaking (contact elements lifted off the contact regions) steps by the contact elements.

Although various preferred embodiments of the present inventions may be utilized for a variety of test region sizes and process head designs, it is preferred that an area of the test region 115 is smaller than 0.1 cm², preferably smaller than 0.05 cm². As described before, obtaining or collecting a depth profile data may involve several electro-etching and measuring periods, possibly hundreds of such periods, when the electrolyte solution in the mini chamber may be replaced by the nonelectrolyte 370 and vice versa. For high-speed collection of depth profile data and for reducing consumables used in the process, it is preferred that the volume of the mini chamber may be smaller than 0.1 cm³, preferably smaller than 0.05 cm³. As the test region size and the volume of the mini chamber are reduced, however, electro-etching and measurement steps may be impacted by entrapment of bubbles at the test region 115, especially near a sealing member of a process cavity (such as the sealing member 201 in FIG. 3), when a liquid may be directed onto a dry test region surface. Therefore, referring back to FIG. 3 and FIG. 3C, in a more preferred embodiment of the present inventions, the nonelectrolyte 370 may be flown into the mini chamber through the inlet 204, while the electrolyte solution 350 may still be in the mini chamber. This way the nonelectrolyte 370 may first mix with and then replace the electrolyte solution 350. This approach may avoid formation of bubbles at the test region 115 since the test region 115 may be kept wet during replacement of the electrolyte solution 350 with the nonelectrolyte 370. At the end of the measurement period, to get ready for the next electro-etching step, the electrolyte solution 350 may be flown into the mini chamber through the inlet 204, while the nonelectrolyte 370 may still be in the mini chamber. This way the electrolyte solution 350 may first mix with and then replace the nonelectrolyte 370. Cycles of the electro-etching step, replacement of the electrolyte solution 350 with the nonelectrolyte 370, and measurement step may then be repeated. This approach may keep the test region 115 wet throughout the electro-etching and measurement periods until the end-point for data collection may be reached. It is preferable that the solvent used in formulating the electrolyte solution 350 is compatible with the nonelectrolyte 370. For example, the electrolyte solution 350 may comprise deionized water, a glycol and ionic species, while the nonelectrolyte 370 may comprise at least one of deionized water and the glycol used in the formulation of the electrolyte solution 350.

Throughout this manuscript the top surface 101A of the semiconductor film 101 is shown to be flat. It should be noted that the methods and apparatus of the present inventions may be used to obtain depth profiles of electrical parameters from non-flat semiconductor films such as semiconductor films in the form of FIN structures.

Therefore, according to the above, some examples of the disclosure are directed to a method of obtaining a depth profile of an electrical property through a semiconductor film of a test pattern, the test pattern comprising a test region with a perimeter, and two or more contact regions, the method comprising the steps of: Forming a sheet of a conductive electrolyte solution over the test region, the sheet also touching an electrode. Then thinning down a semiconductor film portion at the test region by applying a potential difference between the electrode and the test region during an electro-etching period. Then replacing the sheet of the electrolyte solution with a sheet of a fluid that is substantially insulating, and measuring the electrical property of the thinned down semiconductor film portion in presence of the sheet of the fluid over the test region. Additionally, or alternatively to one or more of the examples above, in some examples, the fluid is a gas. Additionally, or alternatively to one or more of the examples above, in some examples, the fluid is a nonelectrolyte. Additionally, or alternatively to one or more of the examples above, in some examples, the steps of forming the sheet of the electrolyte solution, thinning down the semiconductor film portion at the test region, replacing the sheet of the electrolyte solution with the sheet of the nonelectrolyte, and measuring the electrical property are repeated as a surface of the semiconductor film at the test region is continually kept wet. Additionally, or alternatively to one or more of the examples above, in some examples, the electrolyte solution comprises ionic species that conduct electricity. Additionally, or alternatively to one or more of the examples above, in some examples, the nonelectrolyte has a resistivity value of more than 5 mega-ohm-cm. Additionally, or alternatively to one or more of the examples above, in some examples, the nonelectrolyte comprises at least one of water and an organic compound with no added ionic species. Additionally, or alternatively to one or more of the examples above, in some examples, the sheet of the electrolyte solution and the sheet of the nonelectrolyte are contained in a mini chamber formed over the test region.

Although the foregoing description has shown, illustrated and described various embodiments of the present inventions, it will be apparent that various substitutions, modifications and changes to the embodiments described may be made by those skilled in the art without departing from the spirit and scope of the present inventions.

We claim:

1. A method of obtaining a depth profile of an electrical property through a semiconductor film of a test pattern, the test pattern comprising a test region with a perimeter, and two or more contact regions outside the test region, the method comprising:
   forming a mini chamber over the test region, the mini chamber comprising an inlet, an outlet and an electrode;
   introducing an electrolyte solution into the mini chamber through the inlet, the electrolyte solution touching the entire test region and the electrode, without touching any part of the test pattern outside the test region;
   applying an electro-etching potential difference between the electrode and at least one contact region and reducing a thickness of a semiconductor film portion at the test region forming a thinned down semiconductor film portion;
   replacing the electrolyte solution in the mini chamber with a fluid that is substantially insulating; and
   determining the electrical property of the thinned down semiconductor film portion while the fluid is in the mini chamber, wherein the two or more contact regions are configured such that substantially all of an electrical current flowing between any two contact regions passes through the thinned down semiconductor film portion, wherein the step of determining the electrical property comprises flowing a test current between two contact regions, and wherein the fluid is configured to be substantially inert toward the semiconductor film.

2. The method as recited in claim 1, wherein the fluid is a gas.

3. The method as recited in claim 2, wherein the steps of introducing the electrolyte solution into the mini chamber, applying the electro-etching potential difference, replacing the electrolyte solution in the mini chamber with the gas, and determining the electrical property are repeated until an end-point is reached.

4. The method as recited in claim 3, wherein electrical connection to the two or more contact regions is provided by contact elements touching the contact regions, and wherein the contact elements continually touch the two or more contact regions until the end-point is reached.

5. The method as recited in claim 4, wherein the end-point is reached when a thickness of the thinned down semiconductor film portion approaches zero.

6. The method as recited in claim 5, wherein an area of the test region is smaller than 0.1 cm$^2$.

7. The method as recited in claim 6, wherein a volume of the mini chamber is smaller than 0.1 cm$^3$.

8. The method as recited in claim 7, wherein the electrolyte solution comprises a solvent and at least one ionic species.

9. The method as recited in claim 1, wherein the fluid is a nonelectrolyte.

10. The method as recited in claim 9, wherein the step of replacing the electrolyte solution comprises flowing the nonelectrolyte into the mini chamber through the inlet while the electrolyte solution is still in the mini chamber, so that the nonelectrolyte first mixes with and then replaces the electrolyte solution keeping the test region wet.

11. The method as recited in claim 10, wherein the mini chamber is full of the nonelectrolyte prior to the step of introducing the electrolyte solution, and the step of introducing the electrolyte solution comprises flowing the electrolyte solution into the mini chamber through the inlet so that the electrolyte solution first mixes with and then replaces the nonelectrolyte keeping the test region wet.

12. The method as recited in claim 11, wherein the steps of introducing the electrolyte solution into the mini chamber, applying the electro-etching potential difference, replacing the electrolyte solution with the nonelectrolyte, and determining the electrical property are repeated until a sheet resistance of the thinned down semiconductor film portion reaches a threshold value.

13. The method as recited in claim 12, wherein the threshold value is larger than or equal to one percent of a sheet resistance value of the nonelectrolyte.

14. The method as recited in claim 13, wherein electrical connection to the two or more contact regions is provided by contact elements touching the two or more contact regions, and wherein the contact elements continually touch the two or more contact regions until the threshold value is reached.

15. The method as recited in claim 14, wherein the sheet resistance value of the nonelectrolyte is a resistivity of the nonelectrolyte divided by a height of the nonelectrolyte in the mini chamber.

16. The method as recited in claim 15, wherein the height of the nonelectrolyte is substantially equal to a distance between the electrode and the test region.

17. The method as recited in claim 15, wherein the resistivity of the nonelectrolyte is larger than 5 mega-ohm-cm and a chemical etch rate of the semiconductor film in the nonelectrolyte is less than 0.1 Å/minute.

18. The method as recited in claim 17, wherein a distance between the electrode and the test region is configured to be larger than or equal to one half of a distance between two points on the perimeter of the test region measured in a direction substantially parallel to a flow direction of the test current.

19. The method as recited in claim 18, wherein the electrolyte solution comprises a solvent and at least one ionic species.

20. The method as recited in claim 19, wherein the solvent comprises at least one of deionized water and an organic compound.

21. The method as recited in claim 20, wherein the nonelectrolyte comprises at least one of deionized water and the organic compound.

22. The method as recited in claim 20, wherein the organic compound is a glycol comprising at least one of propylene glycol, di-propylene glycol, and ethylene glycol.

23. The method as recited in claim 21 wherein an area of the test region is smaller than 0.1 $cm^2$.

24. The method as recited in claim 23, wherein a volume of the mini chamber is smaller than 0.1 $cm^3$.

* * * * *